US006563345B2

(12) United States Patent
Forbes

(10) Patent No.: US 6,563,345 B2
(45) Date of Patent: May 13, 2003

(54) MONOTONIC DYNAMIC STATIC PSEUDO-NMOS LOGIC CIRCUITS

(75) Inventor: Leonard Forbes, San Diego, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/805,909

(22) Filed: Mar. 15, 2001

(65) Prior Publication Data

US 2002/0130685 A1 Sep. 19, 2002

(51) Int. Cl.[7] ............................................. H03K 19/096
(52) U.S. Cl. ............................................ 326/98; 326/96
(58) Field of Search .............................. 326/98, 95–97, 326/93; 365/203

(56) References Cited

U.S. PATENT DOCUMENTS

| | | | | |
|---|---|---|---|---|
| 4,040,015 A | * | 8/1977 | Fukuda | 326/98 |
| 4,569,032 A | * | 2/1986 | Lee | 708/710 |
| 4,899,066 A | * | 2/1990 | Aikawa et al. | 326/98 |
| 5,426,383 A | * | 6/1995 | Kumar | 326/119 |

FOREIGN PATENT DOCUMENTS

JP  63155822 A * 6/1988 ................. 326/98

OTHER PUBLICATIONS

T. Thorp et al., "Monotonic Static CMOS and Dual $V_T$ Technology", Department of Electrical Engineering, University of Washington, Seattle, WA, (1999); pp. 151–155.
H. Sakamoto et al., "Grounded load complementary FET circuits; Sceptre analysis", IEEE Journal of Solid–State Circuits, vol. SC–8, No. 4, p. 282–4, (1973); Abstract Only.
T. Thorp et al., "Domino logic synthesis using complex static gates", IEEE/ACM International Conference on Computer–Aided Design, Digest of Technical Papers Proceedings of the 1998 IEEE/ACM International Conference on Computer–Aided Design, (1998); Abstract Only.
K. Bernstein et al., "High–Speed Design Styles Leverage IBM Technology Prowess", IBM, pp. 1–6, (1999).

* cited by examiner

Primary Examiner—Michael Tokar
Assistant Examiner—James H Cho
(74) Attorney, Agent, or Firm—Dickstein Shapiro Morin & Oshinsky LLP

(57) ABSTRACT

A method and apparatus for evaluating logical inputs electronically using electronic logic circuits in monotonic dynamic-static pseudo-NMOS configurations. The apparatus includes alternating dynamic and static circuit portions adapted to transition monotonically in response to a common clock (or complemented clock) signal. The circuit portions include pseudo-NMOS configured switching circuits implementing logical functions.

9 Claims, 5 Drawing Sheets

MONOTONIC DYNAMIC STATIC PSEUDO-NMOS LOGIC CIRCUITS

BACKGROUND OF THE INVENTION

1. Field of the Invention

The invention relates to electronic data processing systems implemented in semiconductor integrated circuits and, more particularly, to integrated logic circuits employing MOS technology.

2. Description of the Related Art

Despite great effort expended to reduce the size and increase the speed of integrated circuit devices, the performance of such devices remains limited in certain aspects.

One well known technology used in the fabrication of integrated circuits is static complementary metal oxide semiconductor technology (CMOS). Static CMOS represents an advantageous design approach because it is stable between clock transitions. Accordingly, designing systems using static CMOS technology is relatively easy.

There are, however, important limitations associated with static CMOS logic circuits. One constraint of static CMOS is that each input must drive two transistors. A static CMOS design connects an output node to VDD through PMOS transistors, and the same output node to Ground through NMOS transistors. Every logic input connects to the gate of an NMOS transistor and to the gate of a PMOS transistor, switching one off as the other is switched on. In this way, the output node is switched between approximately ground potential and approximately VDD.

The result is highly deterministic, but each transistor contributes a capacitive load. Consequently, each input sees the capacitance of two gates as a load. It follows that the inputs of a static CMOS gate possess a larger RC time constant than would an input connected to a single comparable transistor gate. The result is that static CMOS is not as fast in operation as alternative technologies that require an input to drive only a single transistor.

In addition to its operating speed consequences, the presence of a second transistor for each gate means that static CMOS requires a relatively large amount of chip real estate. Also, static CMOS circuits require a relatively large number of interconnections, and thus wiring is more complex and requires additional layers of metalization.

Furthermore, static CMOS tends to exhibit relatively high transient power dissipation during switching. The reason for this is apparent from the structure of static CMOS logic, in which a PMOS transistor is operatively connected between a VDD rail and an output node. An NMOS transistor is operatively connected between the same output node and ground. In steady-state operation, one or the other of the NMOS and PMOS transistors is in a nonconductive state, while the other is conductive. Current through the conductive transistor is generally very small, since the typical output is loaded only with the leakage current flowing into the gates of other NMOS transistors.

During switching, however, the situation is different. Each NMOS and PMOS transistor must pass through a linear region during the time when it is switching between on and off states. Accordingly, since the NMOS and PMOS transistors of static CMOS are arranged to switch simultaneously, there is a period of time during which both are in linear operation. During this period, current flows directly from VDD through the PMOS transistor to the output node and from the output node through the NMOS transistor to ground. The product of this current and the voltage drop across the two transistors (VDD) constitutes transient power dissipation. Although brief, this transient is fairly large. The result is significant power dissipation, in those transistors, during switching.

Moreover, because PMOS transistor hole mobility is about three times lower than the mobility of electrons in an NMOS transistor of comparable size, CMOS switching transients are highly asymmetrical. The charge transient of the capacitive load in a static CMOS circuit takes far longer than the discharge transient of the same load. To compensate for this asymmetry, PMOS devices are often fabricated with increased area as compared NMOS devices in the same circuit. While this tends to improve the symmetry of switching transients, it incurs costs measured in additional stray capacitance, a larger RC time constant, and increased area requirements.

It is accordingly clear that, despite its benefits, static CMOS has several significant drawbacks. As a result, several alternative technologies to static CMOS have been developed. These include Monotonic CMOS, Pseudo-NMOS Static Logic, and Zipper Logic. Each of these has certain advantages, but also disadvantages.

Monotonic CMOS circuitry avoids some of the problems of traditional CMOS by limiting the set of allowed transitions so as to take advantage of the faster portions of the asymmetric CMOS switching transients. In Monotonic CMOS circuitry, the large charge-up time through the PMOS devices is effectively hidden by pre-charging the output node to VDD pursuant to a clock signal. When the clock signal is in a pre-charge state, a PMOS pre-charge transistor, receiving the clock signal at its gate, forms a conductive path between VDD and an output node of a Monotonic CMOS circuit. In this way the capacitance of the output node is pre-charged to VDD. When the clock transitions to an evaluation state, the pre-charge transistor is non-conductive, and a combination of PMOS and NMOS transistors, configured otherwise like static CMOS, controls the state of the output node. In like fashion, Monotonic CMOS may also include circuits that pre-charge an output node low. Accordingly, the outputs of a circuit are pre-charged high (for a pull-down gate) or low (for a pull-up gate), depending on the design of the circuit. Note that, during an evaluation period following the pre-charge period the gates behave monotonically; that is, the output state of the circuit either remains unchanged, or transitions in a single direction. For example the only possible output transitions for a pull-down monotonic gate are 1 to 1, or 1 to 0. This contrasts with regular static CMOS in which four transitions are possible; 0 to 0, 1 to 1, 0 to 1, or 1 to 0.

The pull-up and pull-down gates of conventional monotonic static CMOS are cascaded in alternating sequence. By appropriate logic optimization, a circuit can be developed that reduces operating time and power consumption. Each logic input, however, still drives two transistor gates. Thus Monotonic CMOS requires fairly large amounts of chip real estate and provides only a limited improvement over static CMOS in operating speed.

A further conventional approach is to prepare circuits using static pseudo-NMOS technology. Pseudo-NMOS technology differs from CMOS in that each input drives only a single transistor gate. This is achieved by using a PNMOS device as a load. This technology also has certain disadvantages, however. In particular, although wiring complexity is significantly reduced, in comparison to the above noted technologies, static DC power consumption is increased.

A further conventional approach to improving switching speed and gate loading is the use of zipper-CMOS logic circuits. In zipper-CMOS, sequentially alternating circuit portions of NMOS and CMOS employ clocked precharging portions of complementary technology. In zipper CMOS, logic evaluation networks of NMOS transistors connect output nodes to ground, whereas logic evaluation networks of PMOS transistors connect output nodes to VDD.

Although each of the foregoing technologies has desirable aspects, and is advantageously applied in certain circumstances, there exists a need for a family of logic circuits which achieves high speed and low power dissipation within reduced spatial confines.

SUMMARY OF THE INVENTION

The present invention mitigates problems associated with the prior art and provides an advantageous alternative technology.

In a first aspect, the invention provides monotonic dynamic-static pseudo-NMOS logic circuits. Each of these circuits include a plurality of circuit portions, of which at least one is a dynamic pseudo-NMOS portion and one is a static pseudo-NMOS portion. The portions each include power and ground connections, a clock input node, at least one logical input node, and at least one output node. An output node of a dynamic portion is connected to a logical input node of a static portion. In some embodiments further portions are connected in alternating series, an output node of one portion connected to an input node of a following portion; static portions and dynamic portions alternating in turn.

At least one clock node of each portion is connected to either a clock signal, or its complement. Generally, the clock is a free running periodic clock adapted to define a series of consecutive time periods; one being a pre-charge period, the next being an evaluation period, the next being a pre-charge period, and so on. Each dynamic circuit portion includes at least one pre-charge transistor connected between VDD and the output node, and at least one evaluation transistor. In like fashion, each static circuit portion includes at least one pre-charge transistor, and at least one evaluation transistor. The pre-charge transistor of the static circuit portion, however, is connected between the output node and ground. In addition, each static circuit portion includes a pull-up transistor connected between the output node and a source of supply (VDD).

In a one exemplary embodiment all of the evaluation transistors are NMOS transistors. Each logical input connects to the gate of a single NMOS evaluation transistor. The inputs thus see limited capacitive load, and the subject logic family can respond rapidly to input signals.

Evaluation transistors switchably connect the output node of a circuit portion to ground. They may do so in series, the parallel, or in combination thereof, according to the logical function to be implemented.

In each dynamic circuit portion of an exemplary embodiment, a PMOS pre-charge transistor switchably connects a power connection to the output node. The PMOS pre-charge transistor receives the clock signal at its gate, whereby the PMOS pre-charge transistor is controlled to be conductive during a pre-charge period. In a static circuit portion, an NMOS pre-charge transistor recieves a clock signal at its gate, and is conductive during a pre-charge period. The NMOS pre-charge transistor switchably connects a ground connection to the output node of the static circuit portion. Accordingly, the clock signal acts to control the pre-charge transistors so as to pre-charge static portion output nodes toward ground and dynamic portion outpout nodes toward VDD during a pre-charge period.

In a static circuit portion of an exemplary embodiment, the PMOS pull-up transistor is conductive during an evaluation period. During a subsequent evaluation period, the output node of a dynamic portion is either pulled to ground if its evaluation transistors are conductive, or floats with its pre-charged voltage applied to the input of a subsequent portion if its evaluation transistors are non-conductive. During such an evaluation period, the output node of a static portion is either pulled high by the PMOS pull-up transistor, or remains at ground, depending on the conductive state of its evaluation transistors. The conductivity of the pre-charge transistors, of course, depend on the input signals applied to their gates.

In another aspect, the invention includes a method of evaluating electronic logic using the apparatus heretofore described.

In a further aspect, the invention includes a method that includes having first and second circuit portions that are connected together. The first circuit portion is a dynamic pseudo-NMOS circuit including a logical input and a first output node. The second circuit portion is a static pseudo-NMOS circuit including a plurality of logical inputs and a second output node. Normally, the output of the first node is connected to one of the logical inputs of the second circuit portion. The method includes receiving a periodic clock signal at a gate of a transistor switch that is part of the dynamic pseudo-NMOS circuit. The periodic clock signal divides operating time into alternating pre-charge and evaluation periods. Each transition between periods is marked by a transition in the level of the clock signal, either from low to high or high to low.

The embodiments of the invention shown within use NMOS devices for evaluation rather than PMOS devices. This contrasts with zipper-CMOS which employs NMOS and PMOS transistors respectively in alternating logic evaluation stages. Since, as described above, PMOS devices operate more slowly than NMOS devices, the technology presented here offers faster switching speeds at the expense of some additional DC power dissipation.

In a further advantage over conventional technology, it is noted that monotonic dynamic-static pseudo-NMOS logic uses fewer devices, less area, and less wiring to implement a particular logic function than the comparable function implemented with a combination of Domino logic and static CMOS, as currently known in the art.

The devices of the invention can be optimally sized to quickly discharge charged nodes, and quickly charge discharged nodes.

These and other advantages and features of the invention will become more readily apparent from the following detailed description of the invention which is provided in connection with the accompanying drawings

DETAILED DESCRIPTION OF THE PREFERRED EMBODIMENTS

Figure 1:
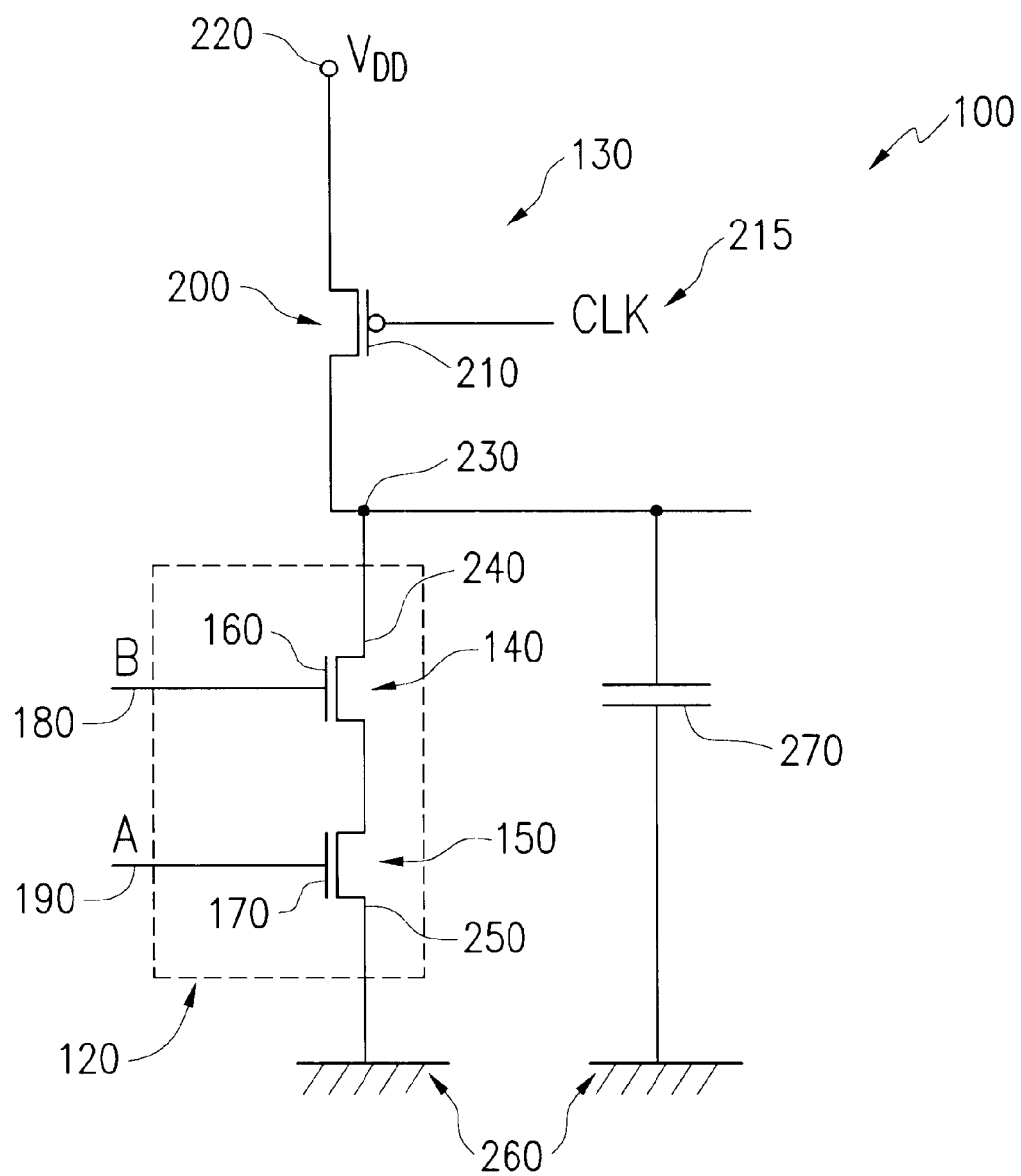
FIG. 1 illustrates a dynamic circuit portion of a Monotonic Dynamic-Static Pseudo-NMOS circuit constructed in one exemplary embodiment.

The present invention will be described as set forth in the exemplary embodiments illustrated in FIGS. 1–4. Other embodiments may be utilized and structural or logical changes may be made without departing from the spirit or scope of the present invention. Like items are referred to by like reference numerals.

In accordance with the present invention, FIG. 1 shows a dynamic monotonic pseudo-NMOS circuit 100. The circuit includes a logic evaluation network 120 and a pre-charge portion 130. In the example shown, the logic evaluation network includes two NMOS evaluation transistors 140,150 arranged in an AND configuration. The gates 160, 170 of the NMOS transistors 140,150 of the evaluation network are operatively connected to, or serve as, respective inputs 180,190 to, the evaluation network 120. The pre-charge portion 130 includes a PMOS transistor 200 with a gate 210. The gate 210 is operatively connected to a source of a clock signal 215. The pre-charge transistor 200 is operatively connected between a source voltage supply at a power node 220, and an output node 230 of the dynamic monotonic pseudo-NMOS circuit 100. Also connected to the output node 230 of the dynamic circuit is the drain terminal 240 of one of the evaluation portion NMOS transistors 140. In the particular embodiment shown, the two NMOS evaluation transistors 140,150 are connected in series, thereby effecting an AND function. As is known in the art, other logical functions could be readily implemented. The source 250 of the second evaluation transistor 150 is operatively connected to an electrical ground 260 as shown. In the illustration, the capacitance of the output node, including trace capacitance and junction capacitance, is expressly represented as a capacitor 270 electrically connected between the output node 230 and ground 260.

Figure 2:
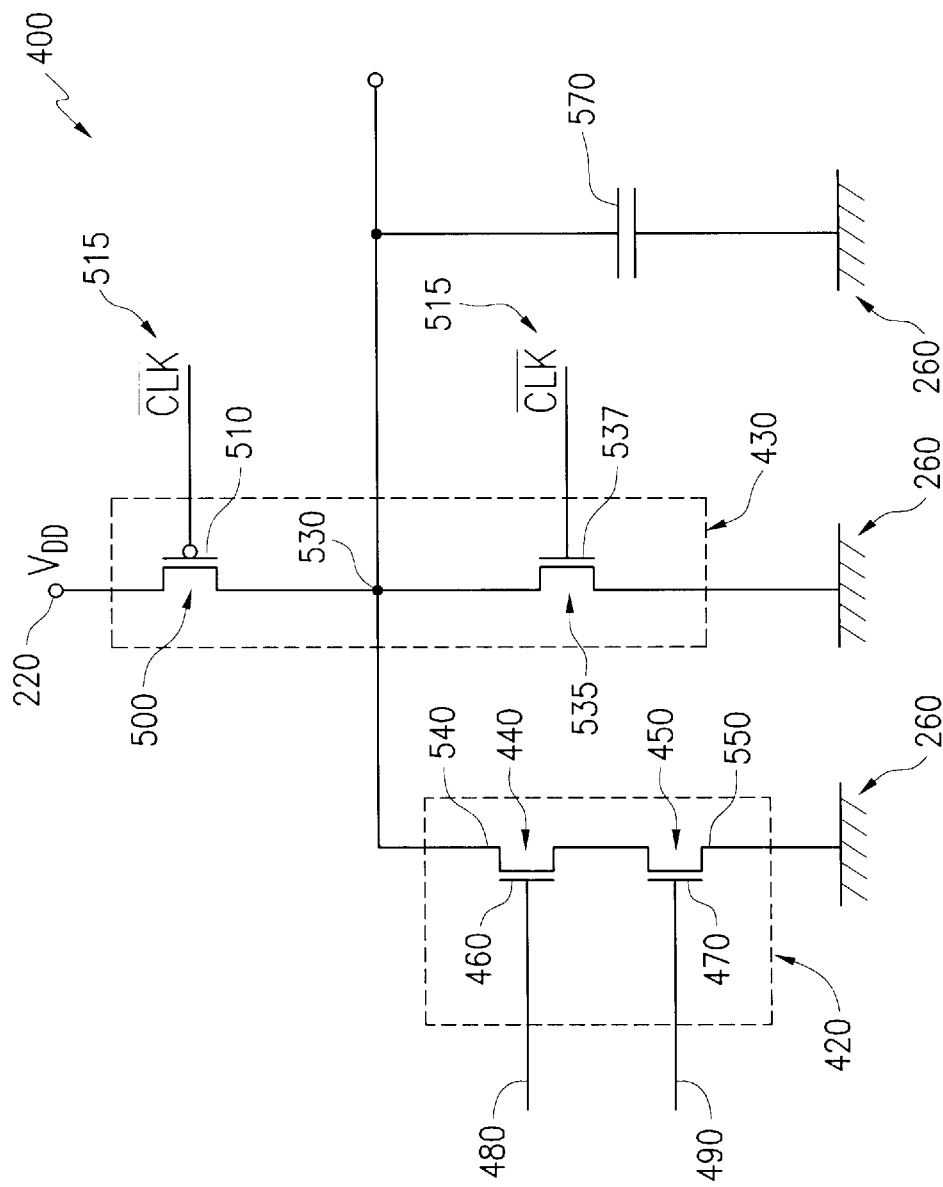
FIG. 2 illustrates a static circuit portion of a Monotonic Dynamic-Static Pseudo-NMOS circuit constructed in one exemplary embodiment.

FIG. 2 shows a static monotonic pseudo-NMOS circuit 400. Like the dynamic circuit 100, the static circuit 400 includes an evaluation network 420, and a pre-charge portion 430. In the example shown, the evaluation network includes two NMOS transistors 440, 450 arranged in an AND configuration. The gates 460, 470 of the NMOS transistors 440, 450 of the evaluation network 420 are operatively connected to, or serve as, respective inputs 480, 490 to, the evaluation network 420. The pre-charge portion 430 includes a PMOS pull-up transistor 500 with a gate 510. The gate 510 is operatively connected to a source of a complemented clock signal 515. The pull-up transistor 500 is operatively connected at its source to a source voltage supply at a power node 220, and at its drain to an output node 530 of the static monotonic pseudo-NMOS circuit 400. Also connected to the output node 530 of the static circuit are the drain of an NMOS pre-charge transistor 535, and a drain terminal 540 of one of the evaluation network NMOS transistors 440. In the particular embodiment shown, the two NMOS evaluation transistors 440, 450 are connected in series, thereby effecting an AND function. As is known to in the art, other functions could readily be implemented. The source 550 of the second evaluation transistor is operatively connected to an electrical ground 260 as shown. Similarly, the source of the pre-charge NMOS transistor 535 is also connected to ground 260. The gate 537 of the pre-charge NMOS transistor 535 is operatively connected to a source of a complemented clock signal ($\overline{CLK}$) 515. As in the case of the dynamic circuit, the capacitance of the output node 530, including trace capacitance and junction capacitance, is expressly represented as a capacitor 570 electrically connected between the output node 530 and ground 260.

Figure 3:
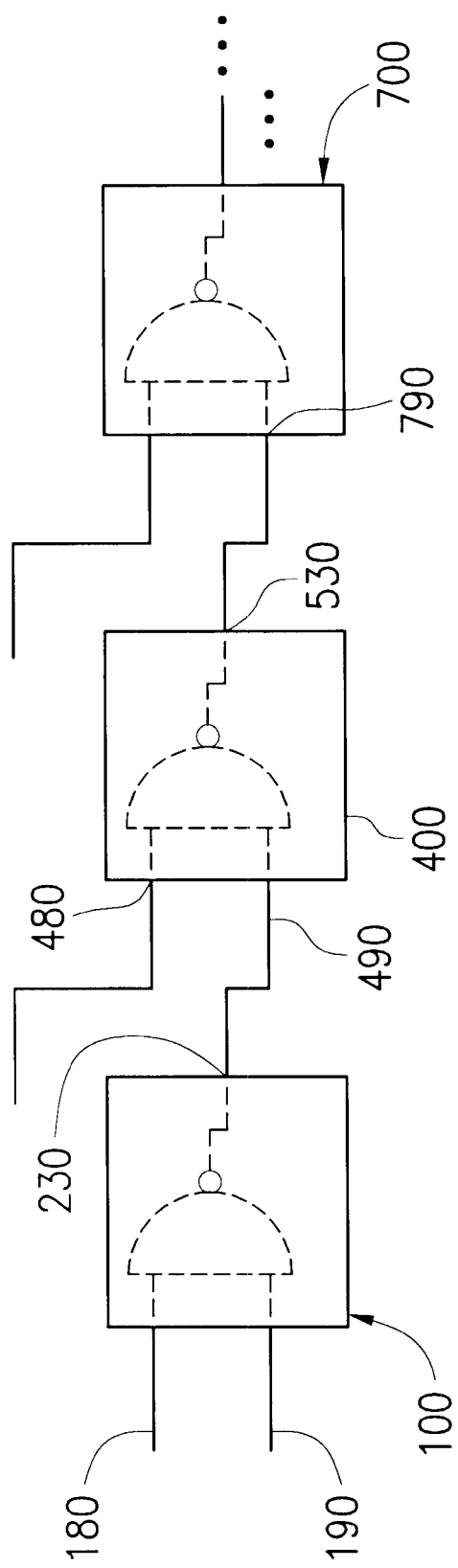
FIG. 3 illustrates the relationship between dynamic and static circuit portions in the exemplary embodiment.

As shown in FIG. 3, the output node 230 of a dynamic circuit portion is connected to an input node 490 of a static circuit portion. In the exemplary embodiment shown, the resulting logical function is a NAND function with two inputs 180,190. Additional circuit portions maybe connected to form arbitrary logical functions. As shown, for example, an additional circuit portion 700 may be connected at an input 790 to the output node 530 of the static monotonic pseudo-NMOS circuit 400.

In operation, the output nodes 230, 530 of a dynamic 100 and static 400 circuit portions are pre-charged during a pre-charge period. The output node 230 of the dynamic portion 100 is pre-charged to a non-ground potential (VDD) 220, and the output node 530 of the static portion 400 is pre-charged to a ground potential 260. Thereafter, in response to a signal (or concurrent signals) at the various clock inputs at 210, 510, 537, the pre-charge transistors, 200 and 535 respectively, are made nonconductive. Charge stored in the capacitance 270 of the output node 230 is then either discharged to ground, or maintained, depending on the conduction state of the evaluation transistors 140, 150 of the evaluation network 120. The resulting electrical potential at output node 230 is applied to the input node 490 of the static circuit portion 400. This represents the evaluation period, as opposed to the pre-charge period. During evaluation period, pre-charge portion NMOS transistor 535 is nonconductive, and pre-charge PMOS transistor 500 is conductive. Accordingly, output node 530 is continuously supplied with power from the VDD node by means of transistor 500. As a result output node 530 assumes a non-ground or ground electrical potential (neglecting evaluation transistor resistance) depending on the state of the evaluation network 420 transistors 440, 450. The state is maintained for the finite duration of the evaluation period, after which, with a further transition of clock signals 215, 515, the system reenters pre-charge state. As is apparent, the system cycles periodically through pre-charge and evaluation periods according to the state of the clock signals 215, 515.

Figure 4:
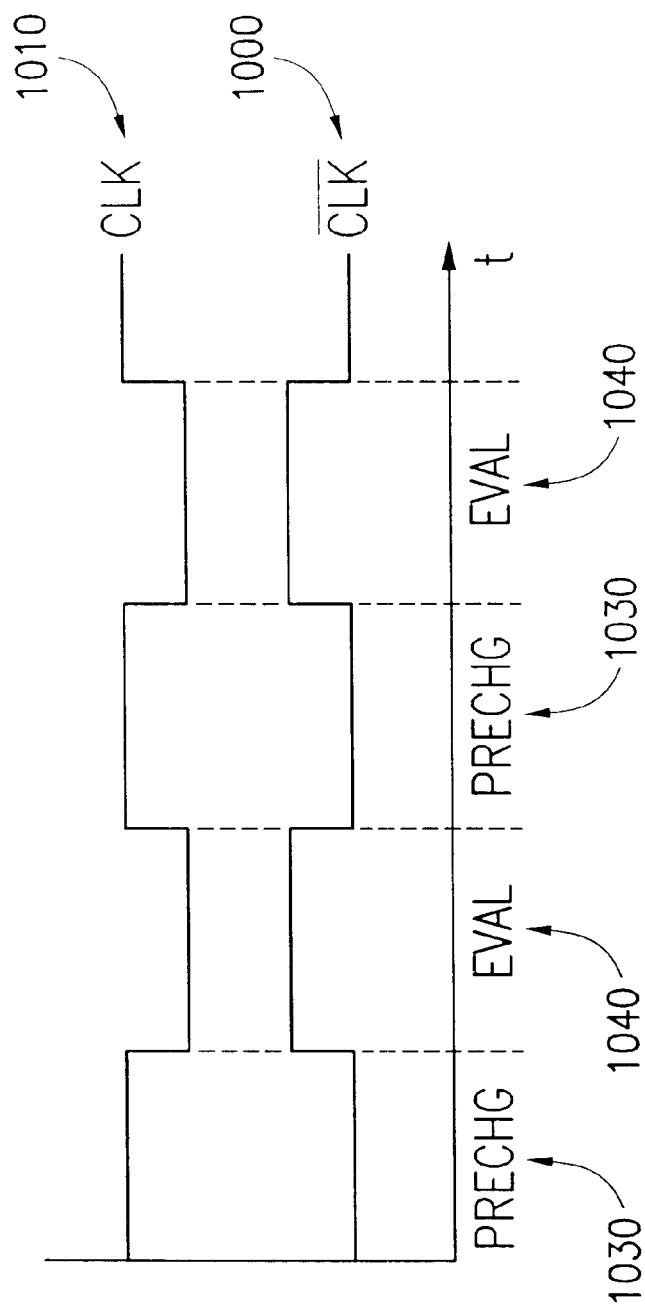
FIG. 4 illustrates the relative timing relationship of a clock signal, its complement, and pre-charge and evaluation periods.

FIG. 4 shows this timing relationship in graphical form. Both clock signal 1000, and complemented clock signal 1010 are shown. As is readily apparent, the signals transition substantially simultaneously, and pass through pre-charge 1030 and evaluation 1040 periods in periodic fashion.

The action of the monotonic dynamic-static pseudo-NMOS gate is thus apparent. During a first pre-charge time period, the output node of each dynamic portion is charged to VDD, and the output node of each static portion is discharged to ground potential. Then, with a clock transition, the circuit enters an evaluation period. The PMOS pre-charge transistor disconnects the output node of the dynamic portion from VDD. Logical inputs are applied to the gates of the NMOS evaluation transistors of the dynamic portion, and the evaluation transistors either leave the output node of the dynamic portion floating at VDD, or connect it to ground, depending on the state of the logical inputs. The static portion combines the state of the output node of the dynamic portion with other inputs applied to its evaluation transistors. These evaluation transistors similarly connect or disconnect the output node of the static circuit to ground. In the meantime, during the evaluation period, a pull-up transistor provides power to the output node of the static circuit portion.

The arrangement described displays many desirable characteristics. Each logical input to the circuit drives only a single NMOS transistor gate. The capacitive load per input is thus substantially smaller than that for a static CMOS circuit implementing equivalent logic. Because the capacitive input load is small, charging currents are likewise small, and power dissipation and switching times are minimized. Switching times are further minimized by the absence of PMOS transistors, with their relatively low majority carrier mobilities, in the logic evaluation networks of the circuit. Finally, by precharging output nodes and assuring monotonic behavior, the asymmetric switching transients of static CMOS logic are avoided, and overall evaluation time is improved.

Figure 5:
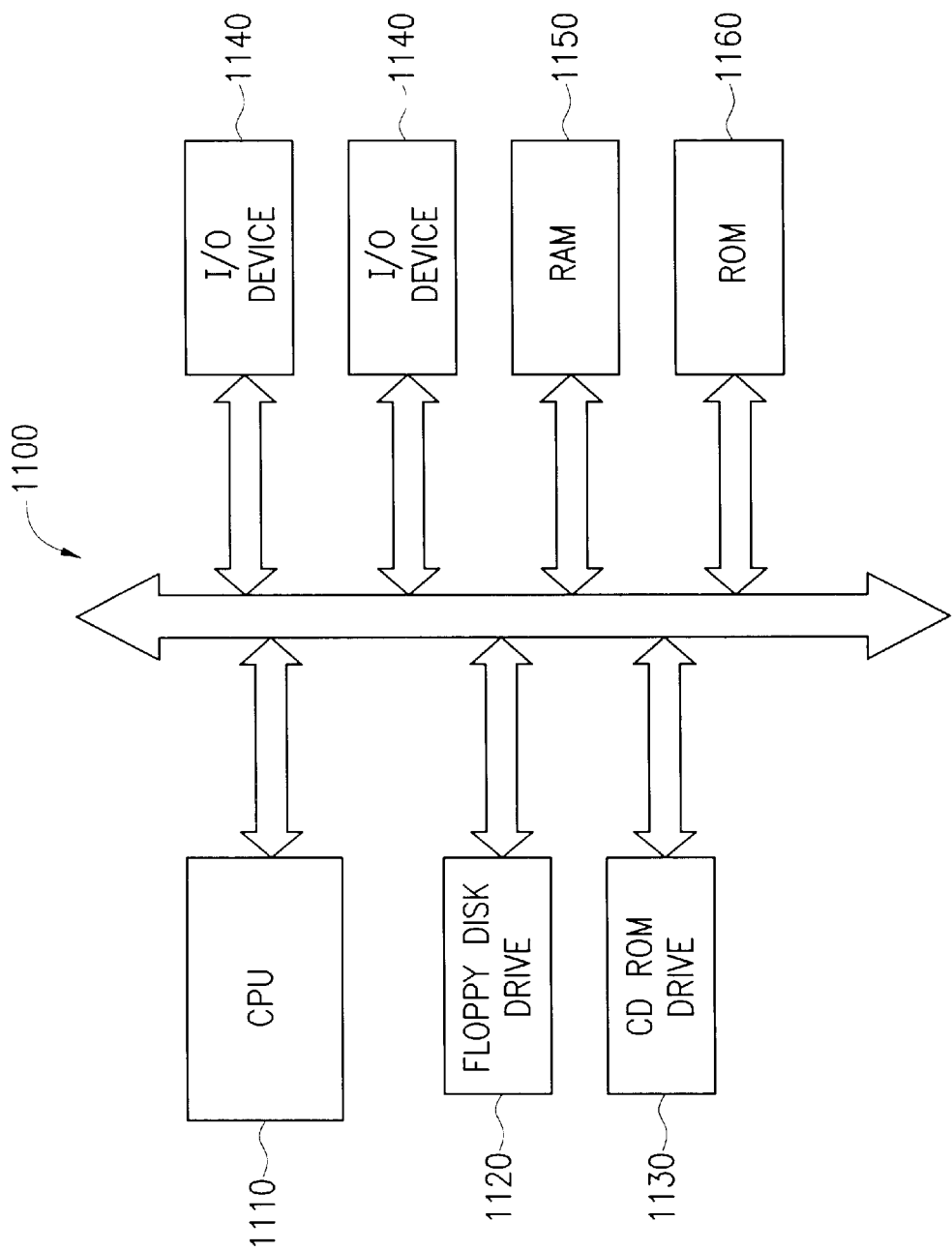
FIG. 5 illustrates, in block diagram form, a system employing Monotonic Dynamic-Static Pseudo-NMOS circuitry.

Monotonic dynamic-static pseudo-NMOS logic, as heretofore described, may thus be used with appropriate optimization to implement arbitrary logic functions with low signal delay and low power consumption. Monotonic Dynamic-Static Pseudo-NMOS logic may be applied in a wide variety of electronic systems. For example, as shown in FIG. 5, a computer system 1100 incorporating the CPU 1110, a floppy disk drive 1120, a CD-ROM drive 1130, I/O devices 1140, and RAM 1150 and ROM 1160 memory offers many opportunities to benefit from the application of this technology. Logic circuits within the CPU 1110, or within the controllers found in the floppy disk drive 1120 and CD-ROM drive over 1130 respectively could be prepared employing Monotonic Dynamic-Static Pseudo-NMOS logic. The subject logic family is particularly applicable to fabrication of random access memory 1150 because it provides high-speed operation. Likewise, I/O devices 1140 would benefit from application of the technology.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. An electronic logic circuit comprising:
a dynamic circuit portion and a static circuit portion, each having a first voltage potential connection, a second voltage potential connection, at least one respective logic signal input, a respective clock input, and a respective output node;
each circuit portion including an evaluation section switchingly connected between said respective output node and said second voltage potential connection, and a respective pre-charge transistor;
each said pre-charge transistor having a respective source, drain, and gate;
said pre-charge transistor of said dynamic circuit portion switchingly connecting said first voltage potential connection to said respective output node;
said pre-charge transistor of said static circuit portion switchingly connecting said second voltage potential connection to said respective output node;
respective gates of said pre-charge transistors being adapted to receive complementary clock signals;
said static circuit portion further including a pull-up device operatively connected between said first voltage potential connection and said respective output node;
said respective output node of said dynamic circuit portion operatively connected to said logic signal input of said static circuit portion.

2. The electronic logic circuit as in claim 1 wherein said each respective evaluation section comprises:
an NMOS transistor having a gate operatively connected to said respective logic signal input.

3. The electronic logic circuit as in claim 1 wherein said pull-up device comprises a PMOS transistor having a source operatively connected to said first potential connection and a drain operatively connected to said respective output node;
said PMOS transistor further having a gate operatively connected to said respective clock input of said static circuit portion.

4. The electronic logic circuit as in claim 1 wherein said pre-charge transistor of said dynamic circuit portion comprises a PMOS transistor.

5. The electronic logic circuit as in claim 1 wherein said pre-charge transistor of said static circuit portion comprises an NMOS transistor.

6. The electronic logic circuit as in claim 1 wherein each said respective evaluation section comprises a plurality of NMOS transistors, each having a respective source and drain;
said respective sources and drains operatively connected so as to form a circuit for implementing a particular logical function.

7. The electronic logic circuit as in claim 1 wherein said respective clock input of said dynamic circuit portion is adapted to receive a first clock signal and said respective clock input of said static circuit portion is adapted to receive a second clock signal;
said first and second clock signals being complementary.

8. The electronic logic circuit as in claim 1 wherein said first voltage potential connection is a non-ground potential connection, and said second voltage potential connection is a ground potential connection.

9. An electronic logic gate comprising:
a first output node having finite capacitance;
a PMOS pre-charge transistor having a source operatively connected to a power supply connection and a drain operatively connected to said first output node;
said PMOS pre-charge transistor having a gate operatively connected to a source of a clock signal;
first and second NMOS evaluation transistors each having respective source, drain and gate connections;
said first evaluation transistor source operatively connected to said first output node, said second evaluation transistor source operatively connected to said drain of said first evaluation transistor, said drain of said second evaluation transistor operatively connected to a ground connection;
said gate inputs of said first and second evaluation transistors respectively each adapted to receiving a logical signal for evaluation;
a second output node having finite capacitance;
an NMOS pre-charge transistor having a source operatively connected to said second output node and a drain operatively connected to said ground connection;
said NMOS pre-charge transistor having a gate operatively connected to a source of a complemented clock signal;

third and fourth NMOS evaluation transistors each having respective source, drain and gate connections;

said third evaluation transistor source operatively connected to said second output node, said fourth evaluation transistor source operatively connected to said drain of said third evaluation transistor, said drain of said fourth evaluation transistor operatively connected to a ground connection;

said gate input of said third transistor adapted to receiving a logical signal for evaluation;

said gate of said fourth evaluation transistor operatively connected to said first output node; and a PMOS pull-up transistor having a source, a drain, and a gate;

said pull-up transistor source operatively connected to said power supply connection, said pull-up transistor drain operatively connected to said second output node, and said pull-up transistor gate operatively connected to said source of said complemented clock signal.

* * * * *

UNITED STATES PATENT AND TRADEMARK OFFICE
CERTIFICATE OF CORRECTION

PATENT NO. : 6,563,345 B2
DATED : May 13, 2003
INVENTOR(S) : Leonard Forbes

It is certified that error appears in the above-identified patent and that said Letters Patent is hereby corrected as shown below:

<u>Column 3,</u>
Line 63, change "recieves" to -- receives --.

<u>Column 6,</u>
Line 13, change "maybe" to -- may be --.

Signed and Sealed this

Fourteenth Day of October, 2003

JAMES E. ROGAN
*Director of the United States Patent and Trademark Office*